United States Patent
Rostoker et al.

(10) Patent No.: US 6,373,447 B1
(45) Date of Patent: Apr. 16, 2002

(54) ON-CHIP ANTENNA, AND SYSTEMS UTILIZING SAME

(75) Inventors: Michael D. Rostoker, Boulder Creek; Kumaraguru Muthukumaraswamy, Santa Clara, both of CA (US)

(73) Assignee: Kawasaki Steel Corporation, Tokyo (JP)

( * ) Notice: Subject to any disclaimer, the term of this patent is extended or adjusted under 35 U.S.C. 154(b) by 0 days.

(21) Appl. No.: 09/221,258

(22) Filed: Dec. 28, 1998

(51) Int. Cl.[7] ................................................. H01Q 1/36
(52) U.S. Cl. ..................... 343/895; 340/572.7; 257/491
(58) Field of Search .................................. 343/895, 795, 343/793, 873, 700 MS; 340/572.7, 825; 257/531, 666, 679, 790, 491, 777; H01Q 1/36

(56) References Cited

U.S. PATENT DOCUMENTS

| | | | |
|---|---|---|---|
| 4,724,427 A | 2/1988 | Carroll | 340/572 |
| 4,857,893 A * | 8/1989 | Carroll | 340/572 |
| 5,023,624 A * | 6/1991 | Heckaman et al. | 343/860 |
| 5,202,752 A | 4/1993 | Honjo | 257/678 |
| 5,345,231 A | 9/1994 | Koo et al. | 340/870.31 |
| 5,717,231 A * | 2/1998 | Tserng et al. | 257/276 |
| 5,764,655 A | 6/1998 | Kirihata et al. | 371/22.5 |
| 5,929,825 A * | 7/1999 | Niu et al. | 343/895 |
| 5,999,409 A * | 12/1999 | Ando et al. | 361/737 |
| 6,096,496 A | 8/2000 | Frankel | 435/4 |
| 6,161,205 A | 12/2000 | Tuttle | 714/724 |
| 6,181,001 B1 * | 1/2001 | Ikefuji et al. | 257/679 |
| 6,201,296 B1 * | 3/2001 | Fries et al. | 257/679 |

* cited by examiner

*Primary Examiner*—Don Wong
*Assistant Examiner*—Trinh Vo Dinh
(74) *Attorney, Agent, or Firm*—Gerald E. Linden

(57) ABSTRACT

One or more antennas are formed on an integrated circuit (IC) chip and connected to other circuitry on the IC chip. Antenna configurations include loop, multi-turn loop, square spiral, long wire, or dipole. The antenna may be formed to have two or more segments which can selectively be connected to one another to alter an effective length of the antenna. Two antennas may be formed in two different metallization layers separated by an insulating layer. Additionally, an antenna may be incorporated in a heat sink structure that is joined to the IC chip. IC chips having antennas are suitably included in a system or subsystem having electrical functionality, such as general purpose computers, telecommunications devices, and the like.

23 Claims, 11 Drawing Sheets

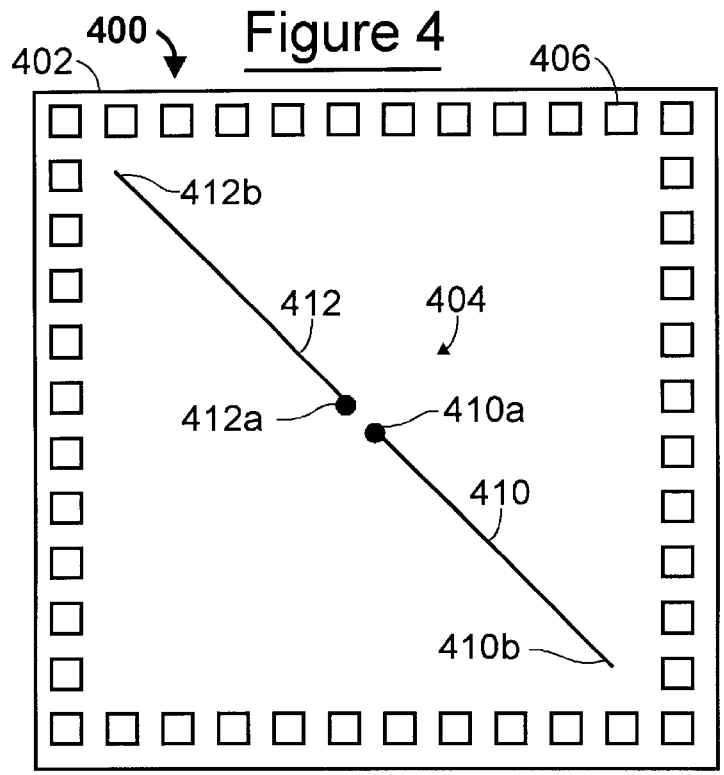
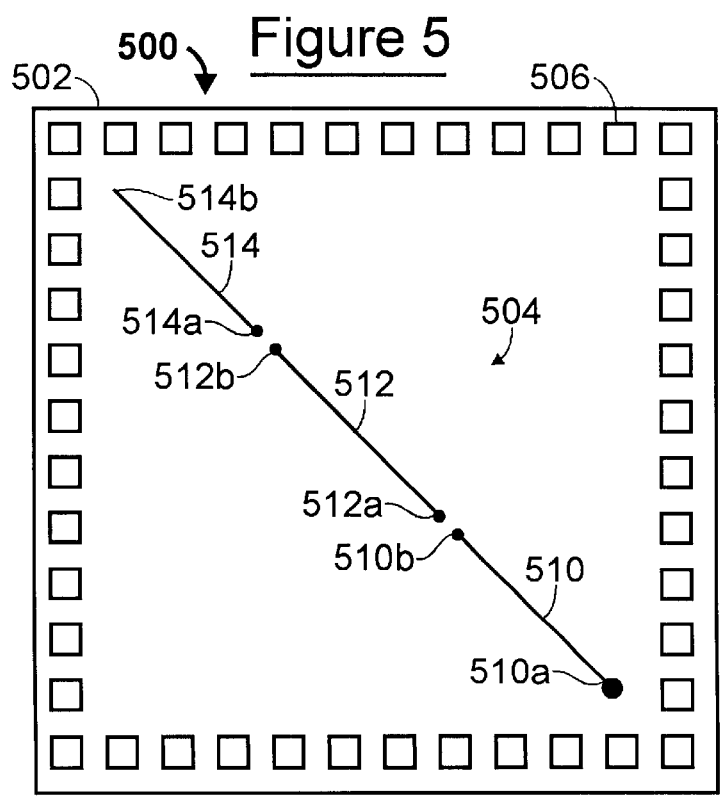

1800

1900

ON-CHIP ANTENNA, AND SYSTEMS UTILIZING SAME

TECHNICAL FIELD OF THE INVENTION

The present invention relates to semiconductor integrated circuit (IC) devices (chips) and, more particularly, to IC chips having an antenna formed thereon.

BACKGROUND OF THE INVENTION

With increasing dependents on local and wide area wireless networks, particularly those with low power (range) requirements, there is perceived to be a need to have an antenna structure integrated onto single semiconductor devices. One important lack has been an on-chip antenna structure.

The length and material of antennas normally determine the frequency and intensity of signals that maybe received or sent from the antenna. However with smaller and smaller local area wireless networks being contemplated, the concept of a room sized network area or building area with antennas mounted in walls and ceilings (whether independent separate antennas or multi-use antennas, such as using electrical wiring or telephone wiring as an antenna structure), the feasibility of using very low power antenna structures to transfer information from a local network to a wireless IC device or system containing such wireless IC device becomes practicable.

DISCUSSION OF THE PRIOR ART

The following documents, all of which are U.S. patents, all of which are incorporated by reference herein, disclose various techniques having some relevance to the present invention.

U.S. Pat. No. 4,724,427 (Feb. 2, 1998) discloses a transponder device. FIG. 9 of the patent, reproduced as FIG. 1 herein, shows a topographical representation of a transponder chip 100 in an embodiment that includes an antenna coil 104 as part of a monolithic chip 102. As disclosed therein, the coil 104 is etched around the periphery of the chip substrate 102. In the center of the coil 104 are found a custom logic circuit 106, a programmable memory array 108, and memory control logic 110. Using the chip topography shown in this figure, a functionally complete transponder may be realized on a single semiconductor chip. (see column 11, lines 7–22; numbers edited)

In a similar manner, U.S. Pat. No. 5,345,231 (September 1994) discloses a contactless inductive data-transmission system. FIG. 7 of the patent shows components of a chip having a substrate 52 which can photolithographically be integrated, including antenna coils 50 which can be in a plane above the semiconductor topography 51 of the chip. (column 7, lines 14–17) Notably, the antenna coils So are disposed around the periphery of the chip, as was the case in U.S. Pat. No. 4,724,427.

Various problems are attendant integrating an antenna on an integrated circuit (IC) chip. In the case of an antenna disposed about the periphery of the chip, as described by the patents discussed hereinabove, the location of the antenna interferes with conventional bond pad layout about the periphery of the chip. Also, the electromagnetic fields within the central area of an antenna laid out about the periphery of a chip can interfere with the operation of circuits located within the antenna.

Glossary

Unless otherwise noted, or as may be evident from the context of their usage, any terms, abbreviations, acronyms or scientific symbols and notations used herein are to be given their ordinary meaning in the technical discipline to which the invention most nearly pertains. The following terms, abbreviations and acronyms may be used in the description contained herein:

A/D: Analog-to-Digital (converter).
ALU: Arithmetic Logic Unit.
ASIC: Application-Specific Integrated Circuit.
ATM: Asynchronous Transfer Mode
bit: binary digit.
BLP: Board-Level Product.
byte: eight contiguous bits.
C: a programming language.
CAM: Content-Addressable Memory.
CAS: Column Address Strobe.
CCD: Charge-coupled device.
CD: Compact Disc.
CISC: Complex Instruction Set Computer (or Chip).
CMOS: Complementary Metal-Oxide Semiconductor.
CODEC: Encoder/De-Coder. In hardware, a combination of A/D and D/A converters. In software, an algorithm pair.
Core: A functional block intended to be embedded and integrated in broader logic design.
CPU: Central Processing Unit.
D/A: Digital-to-Analog (converter).
DAT: Digital Audio Tape.
DBS: Direct Broadcast Satellite.
DMA: Direct Memory Access.
DRAM: Dynamic Random Access Memory.
DSP: Digital Signal Processing (or Processor).
ECC: Error Correction Code.
EDO: Extended Data Output.
EDRAM: Extended DRAM.
EEPROM: Also E2PROM. An electrically-erasable EPROM.
EPROM: Erasable Programmable Read-Only Memory.
Flash: Also known as Flash ROM. A form of EPROM based upon conventional UV EPROM technology but which is provided with a mechanism for electrically pre-charging selected sections of the capacitive storage array, thereby effectively "erasing" all capacitive storage cells to a known state.
FPGA: Field-Programmable Gate Array
G: or (Giga), 1,000,000,000.
Gbyte: Gigabyte(s).
GPIO: General Purpose Input/Output.
HDL: Hardware Description Language.
HDTV: High Definition Television
IC: Integrated Circuit.
I/F: Interface.
I/O: Input/Output.
IEEE: Institute of Electrical and Electronics Engineers
JPEG: Joint Photographic Experts Group
K: (or kilo), 1000.
kernel: a core functionality of an operating (or other software) system.
KHz: KiloHertz (1,000 cycles per second).
LAN: Local Area Network M: (or mega), 1,000,000

MAC: Media Access Control.

Mask ROM: A form of ROM where the information pattern is "masked" onto memory at the time of manufacture.

MCM: Multi-Chip Module.

Mb Megabyte memory: hardware that stores information (data).

MHz: MegaHertz (1,000,000 cycles per second).

MIPS: Million Instructions Per Second

MLT: Multi-Level Technology.

MPEG: Motion Picture Experts Group. Standard for encoding moving images. Also widely used for high quality audio compression.

MPU: Micro Processing Unit.

NVRAM: Non-volatile RAM.

PLL: Phase Locked Loop.

PROM: Programmable Read-Only Memory.

PWM: Pulse Width Modulation.

PLD: Programmable Logic Device.

RAS: Row Address Strobe.

RAM: Random-Access Memory.

RISC: Reduced Instruction Set Computer (or Chip).

ROM: Read-Only Memory.

RTOS: Real Time Operation System

SCM: Single Chip Module

SDRAM: Synchronous DRAM.

SIE: Serial Interface Engine.

SOC: System On a chip software: Instructions for a computer or CPU.

SRAM: Static Random Access Memory.

TCP/IP: Terminal Control Protocol/internet Protocol.

UART: Universal Asynchronous Receiver/Transmitter.

USB: Universal Serial Bus.

UV EPROM: An EPROM. Data stored therein can be erased by exposure to Ultraviolet (UV) light.

VCR: Video Cassette Recorder.

VHDL: VHSIC (Very High Speed Integrated Circuit) HDL.

WAN: Wide Area Network. Such as the telephone system or the Internet, or a satellite network.

ZISC: Zero Instruction Set Computer (or Chip).

BRIEF DESCRIPTION (SUMMARY) OF THE INVENTION

An object of the invention is to provide an improved technique for integrating an antenna on an integrated circuit (IC) chip.

Another object of the invention is to provide techniques for integrating multiple antennas on an integrated circuit (IC) chip.

According to the invention, a layer or multiple layers of connected metal (or other suitable conductive material such as polysilicon) are placed on an integrated circuit (IC) chip so as to form an antenna structure.

One or more antennas may thus be formed on an IC chip.

Such antennas may be in a single plane of metal, or may be in multiple planes of metal connected as by filled vias.

Additionally the on-chip (or on the IC chip) antenna structure maybe connected electrically with an additional antennae such as could be achieved on a substrate material or an attachable package including a heatsink antenna attached to the package.

Additionally as new packaging techniques including ball grid arrays (BGA), particularly micro-ball grid arrays ($\mu$BGA) on the IC chip instead of bond pads, allow greater opportunities for interconnection on an IC chip, larger antenna structures may be integrated onto an IC chip without extensive routing problems as would have occurred with exclusively periphery leads.

Various shapes and forms of antennas are disclosed herein, including peripheral wraps square-shaped spirals loop-spirals and s-curve or z-curve structures.

The use of multiple antennas allows for separate transmitting and receiving antennas, as well as two antennas cooperating with one another to form either a wave guide arrangement (shaped propagation) or various forms of shielding to block signals from the antenna permitting directional or specific narrow frequency bandwidth passing to the antenna on the die.

Additionally, capacitors and inductors may be integrated on the IC chip along with the antenna(s).

The invention has utility in communication applications such as pagers, cordless telephones, analog and digital cellular telephones and personal communication systems.

An integrated circuit (IC) employing the techniques of the present invention may be included in a system or subsystem having electrical functionality. Exemplary systems and subsystems that would benefit from the techniques disclosed herein may include general purpose computers and processors; communications and telecommunications devices (e.g., phones, faxes, etc.); networks; consumer devices; audio and visual (video) receiving, recording and display devices; transportation systems (e.g., vehicles); electromechanical devices, smart cards, etc.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments.

Certain elements in selected ones of the drawings may be illustrated not-to-scale, for illustrative clarity.

Often, similar elements throughout the drawings may be referred to by similar references numerals. For example, the element 199 in a figure (or embodiment) may be similar in many respects to the element 299 in an other figure (or embodiment). Such a relationship, if any, between similar elements in different figures or embodiments will become apparent throughout the specification, including, if applicable, in the claims and abstract.

In some cases, similar elements may be referred to with similar numbers in a single drawing. For example, a plurality of elements 199 may be referred to as 199a, 199b, 199c, etc.

The cross-sectional views, if any, presented herein may be in the form of "slices", or "near-sighted" cross-sectional views, omitting certain background lines which would otherwise be visible in a true cross-sectional view, for illustrative clarity.

Figure 1:
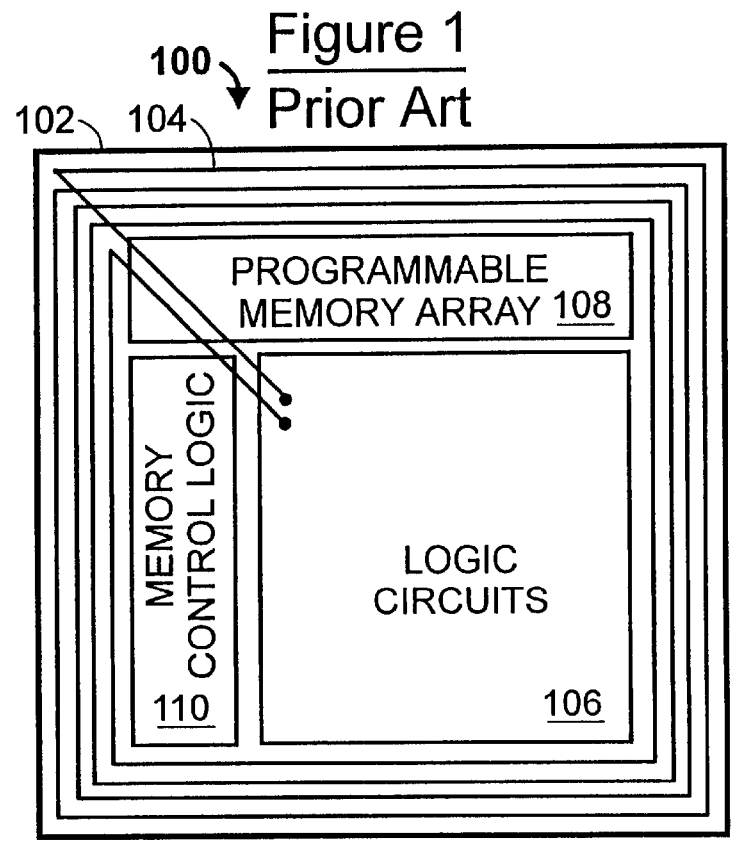
Figure 2:
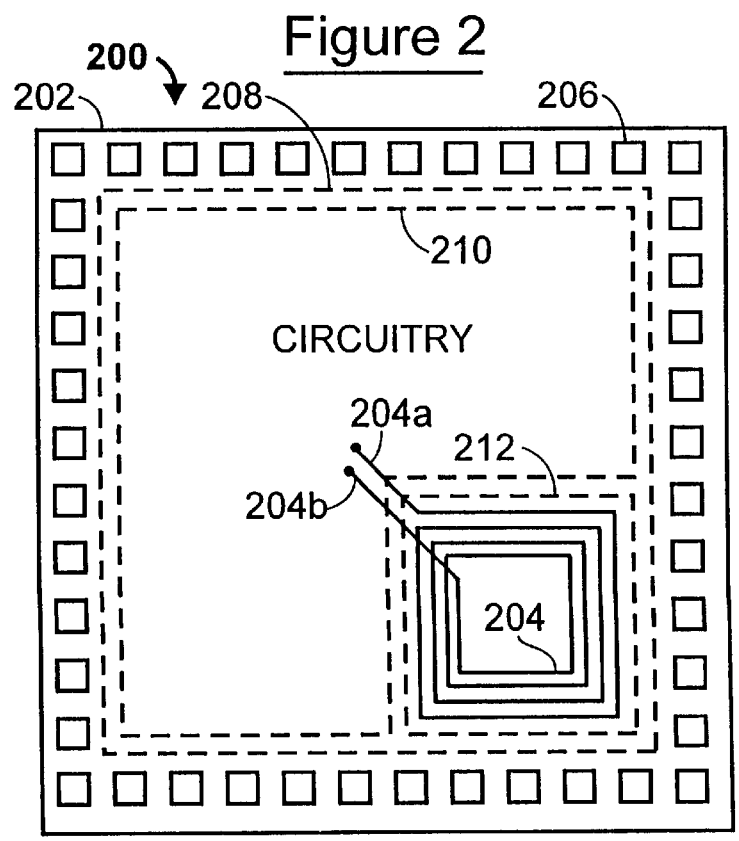
Figure 3:
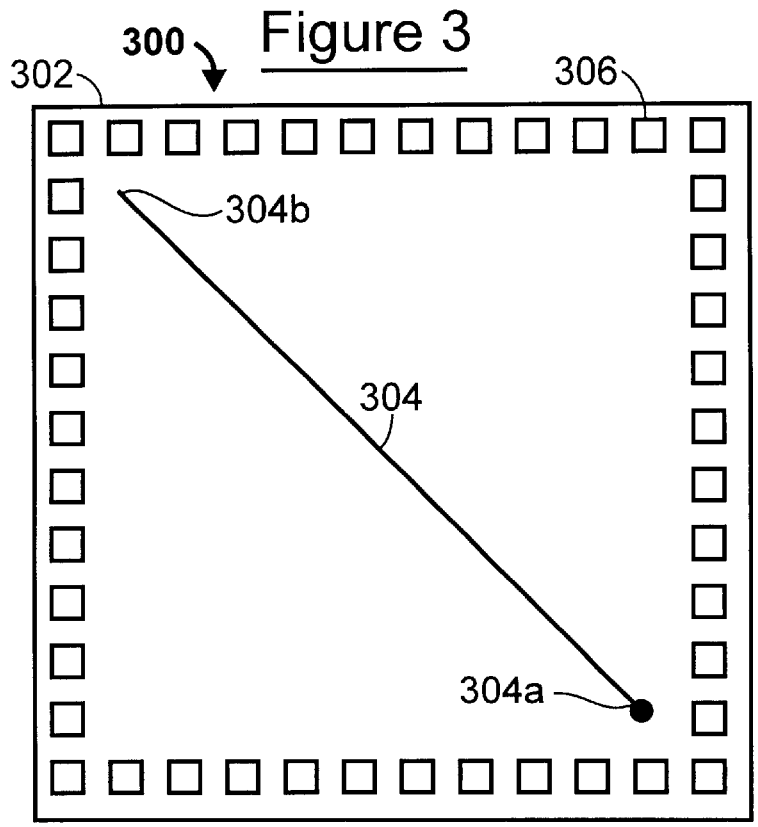
Figure 3A:
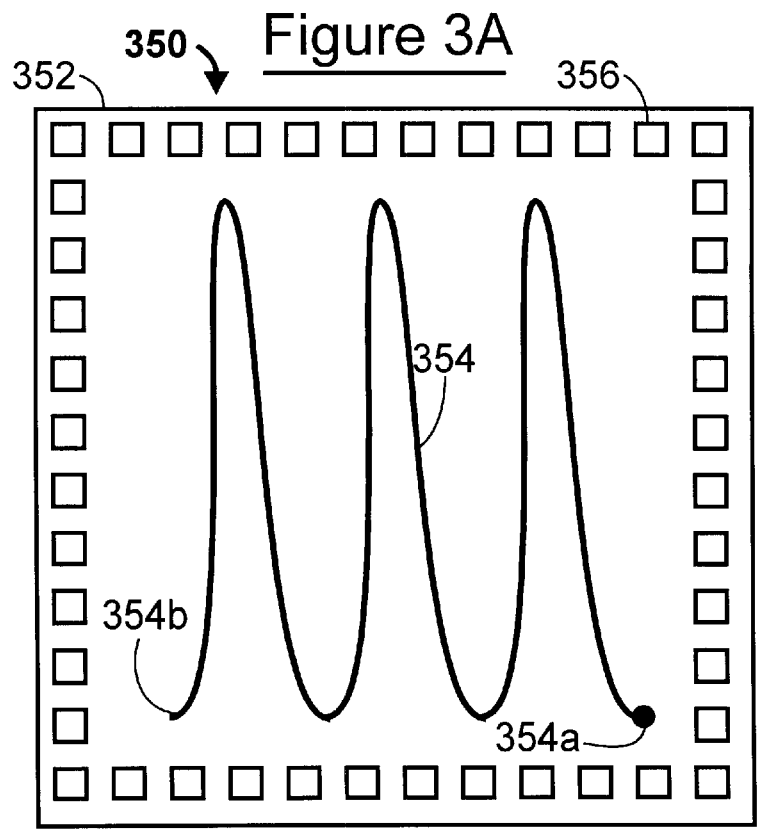
Figure 6:
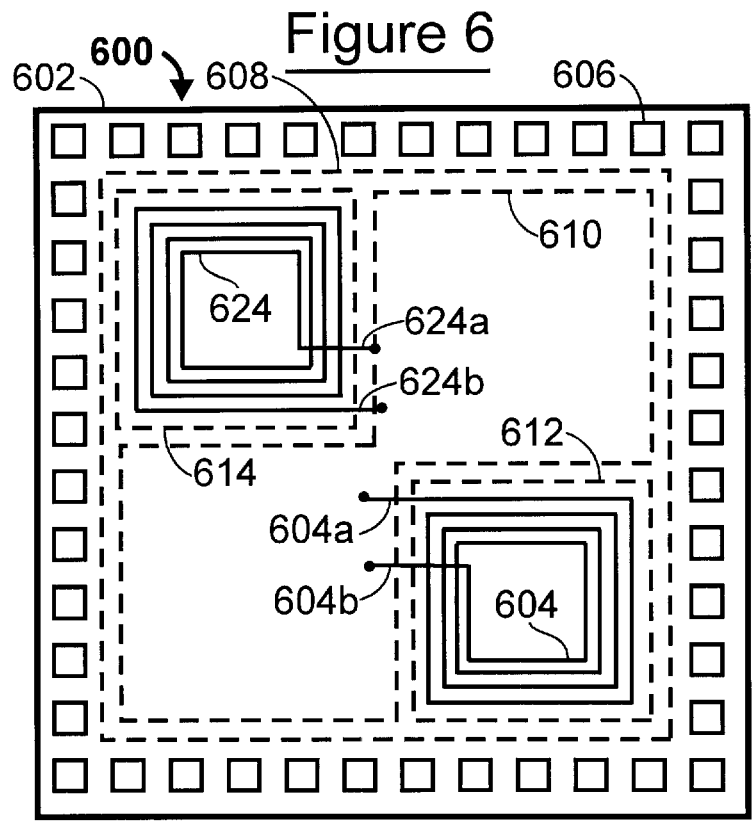
Figure 8:
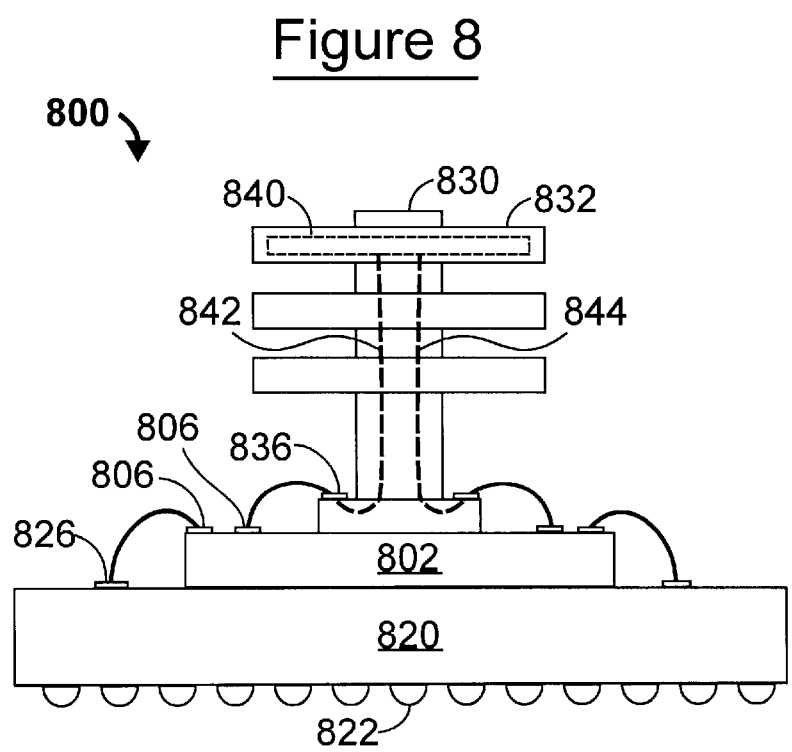
Figure 7A:
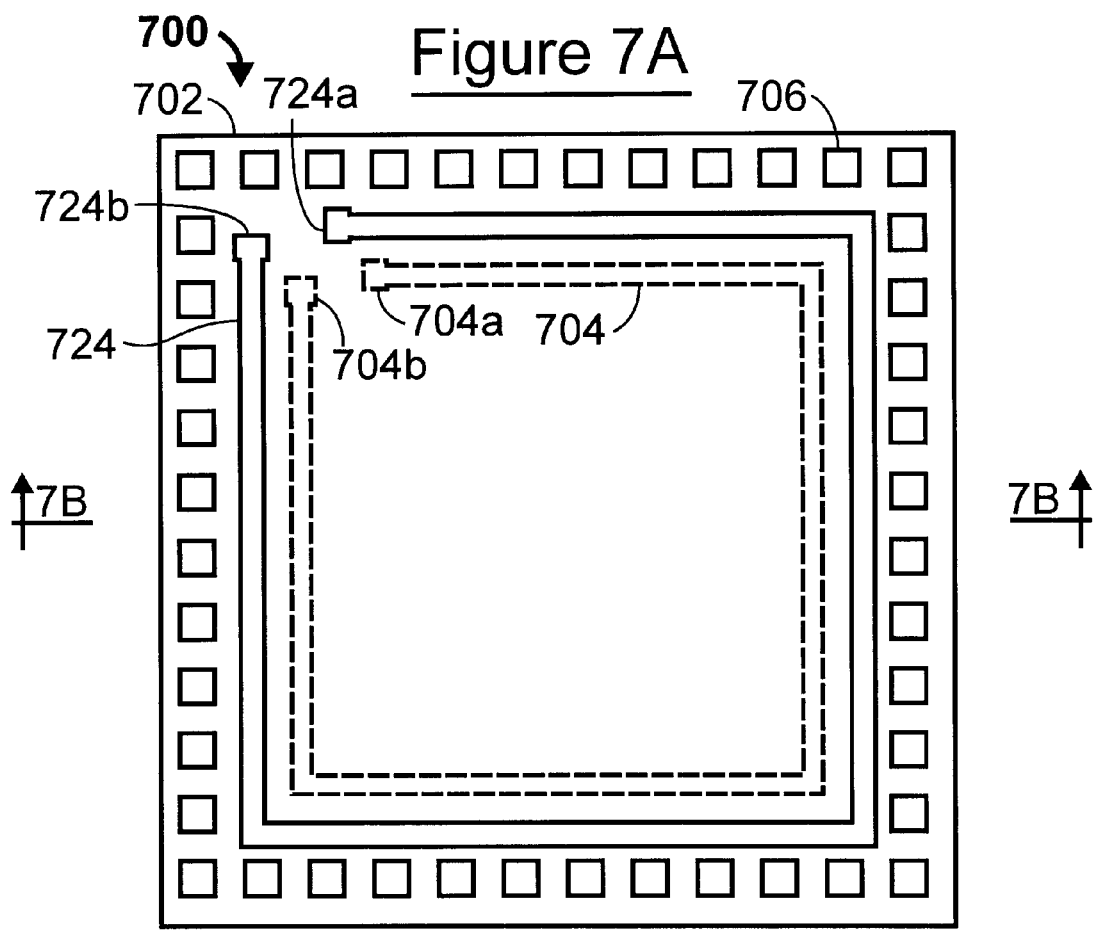
Figure 7B:
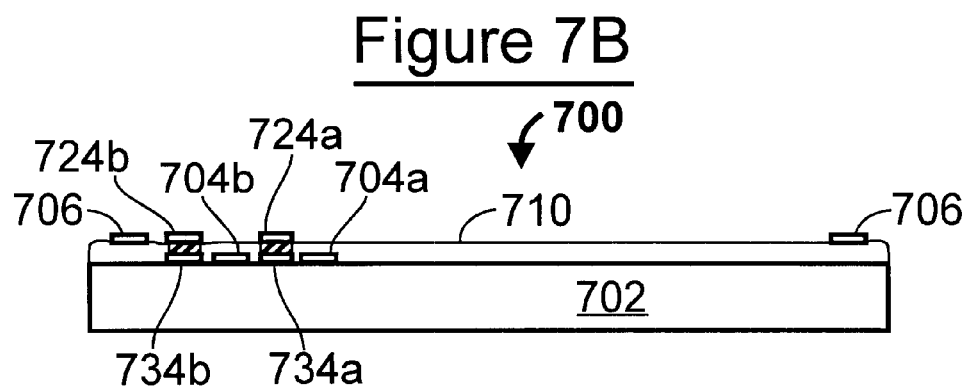
Figure 9:
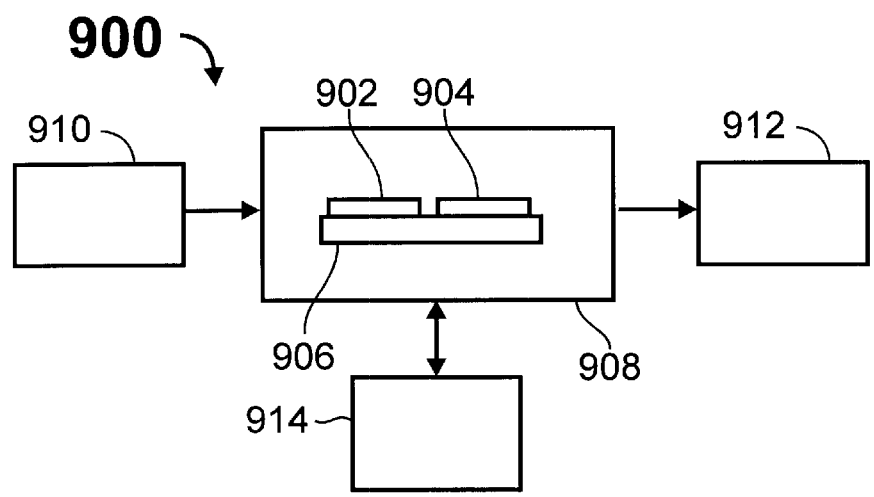
Figure 9A:
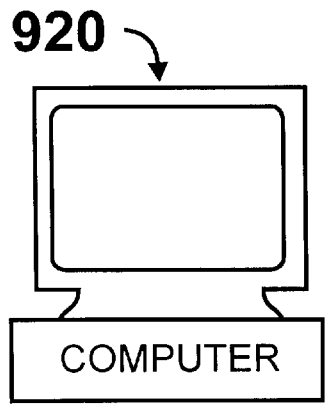
Figure 9B:
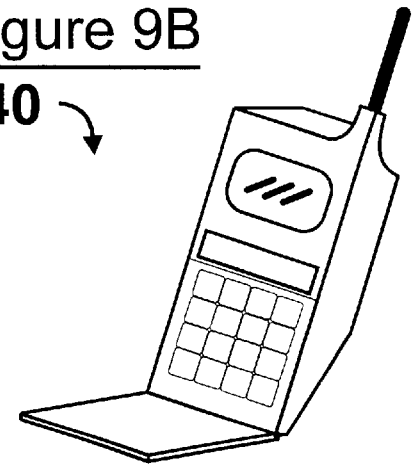
Figure 10:
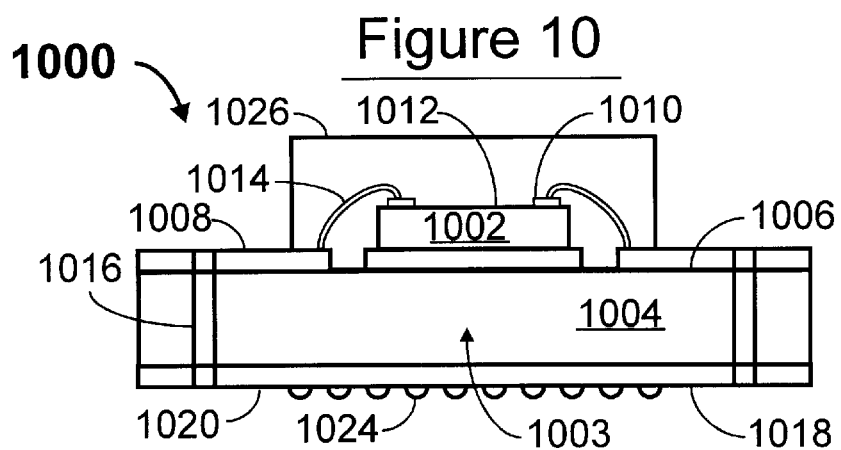
Figure 11:
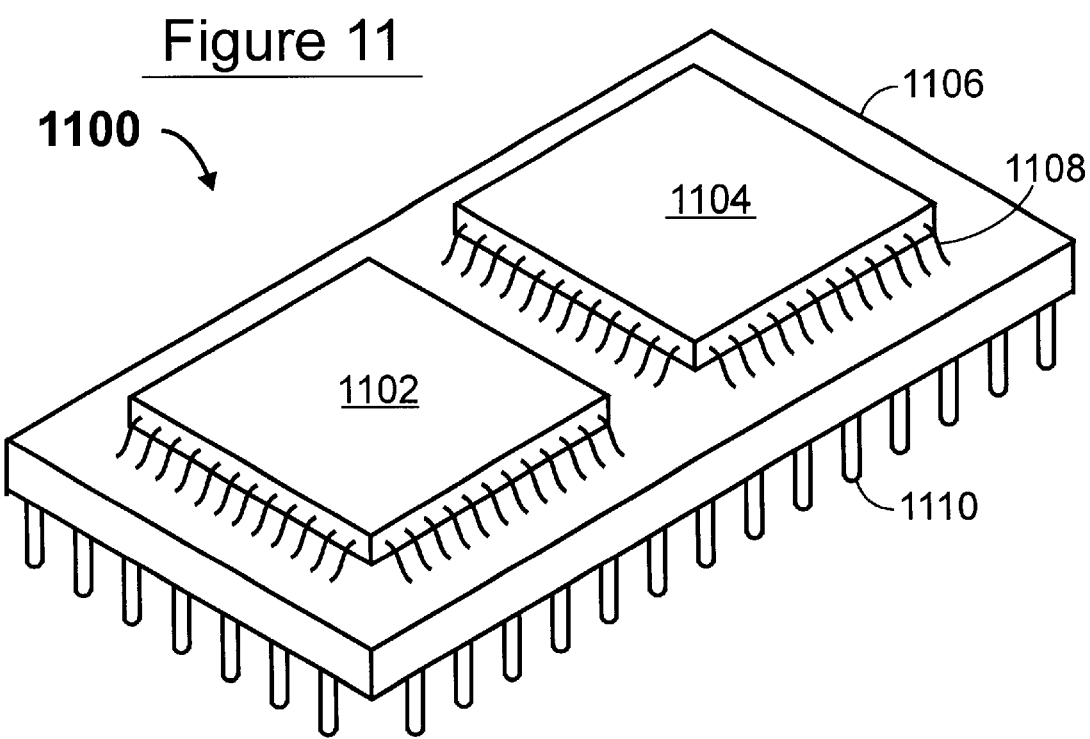
Figure 12:
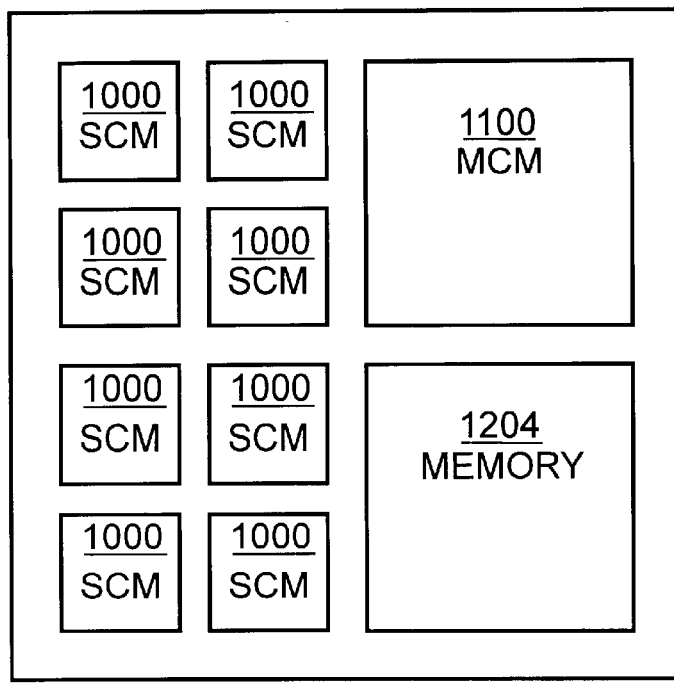
Figure 13:
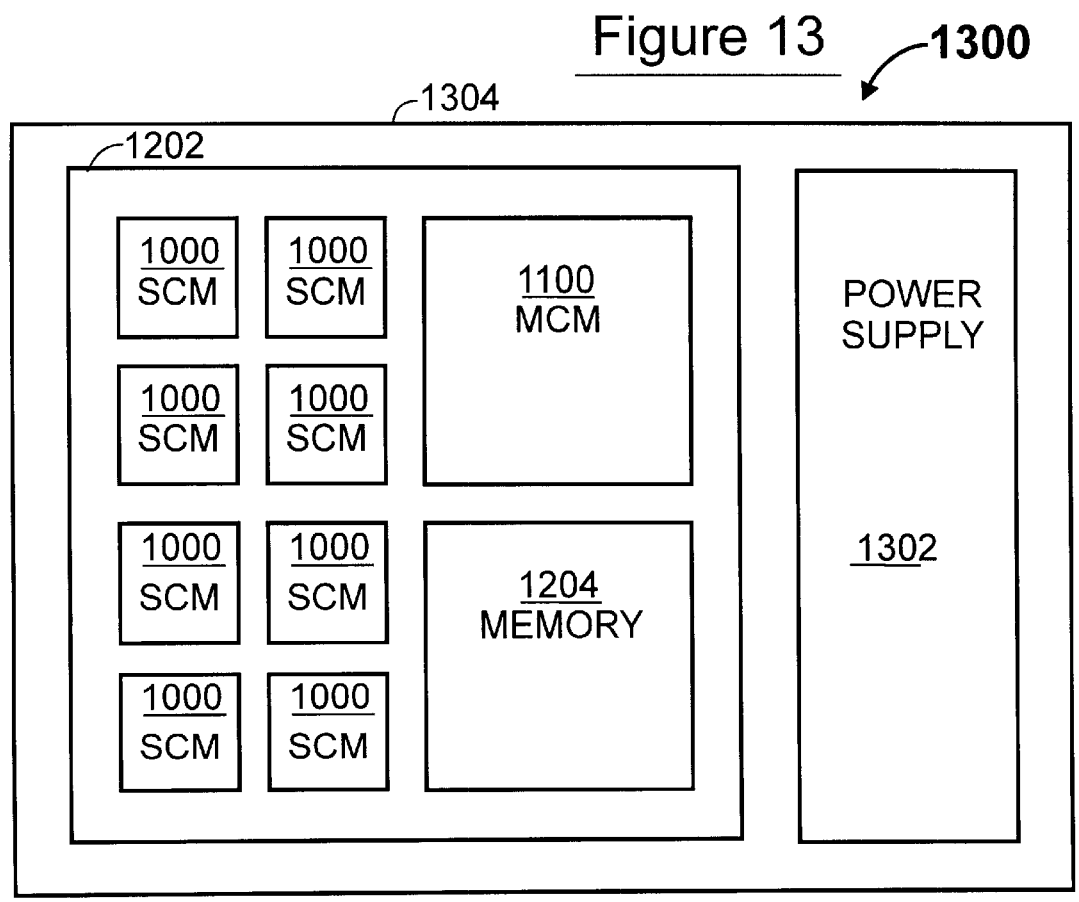
Figure 14:
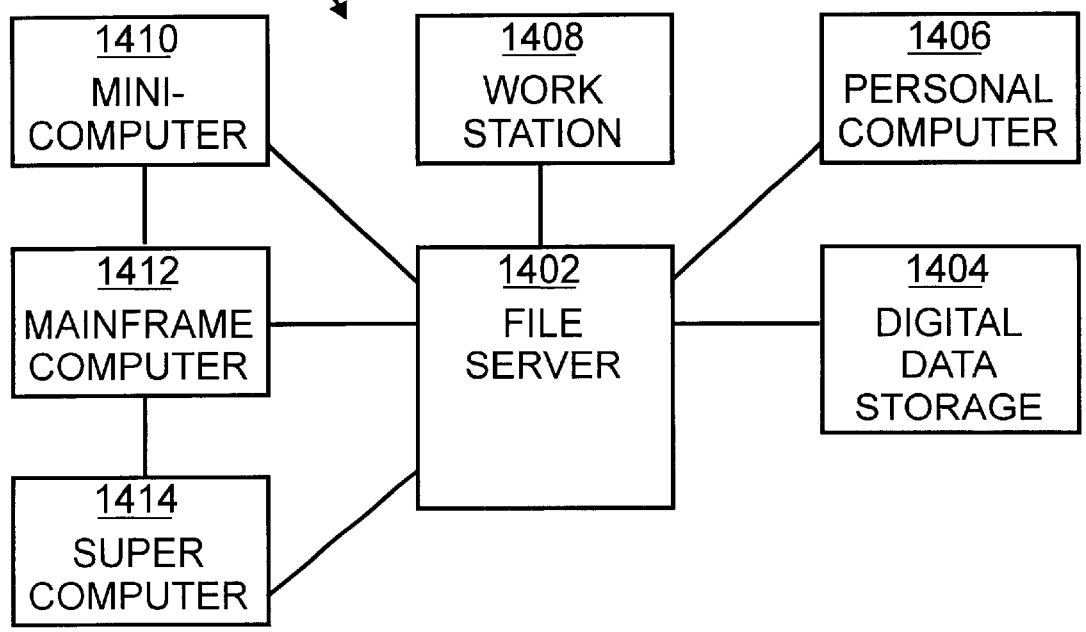
Figure 15:
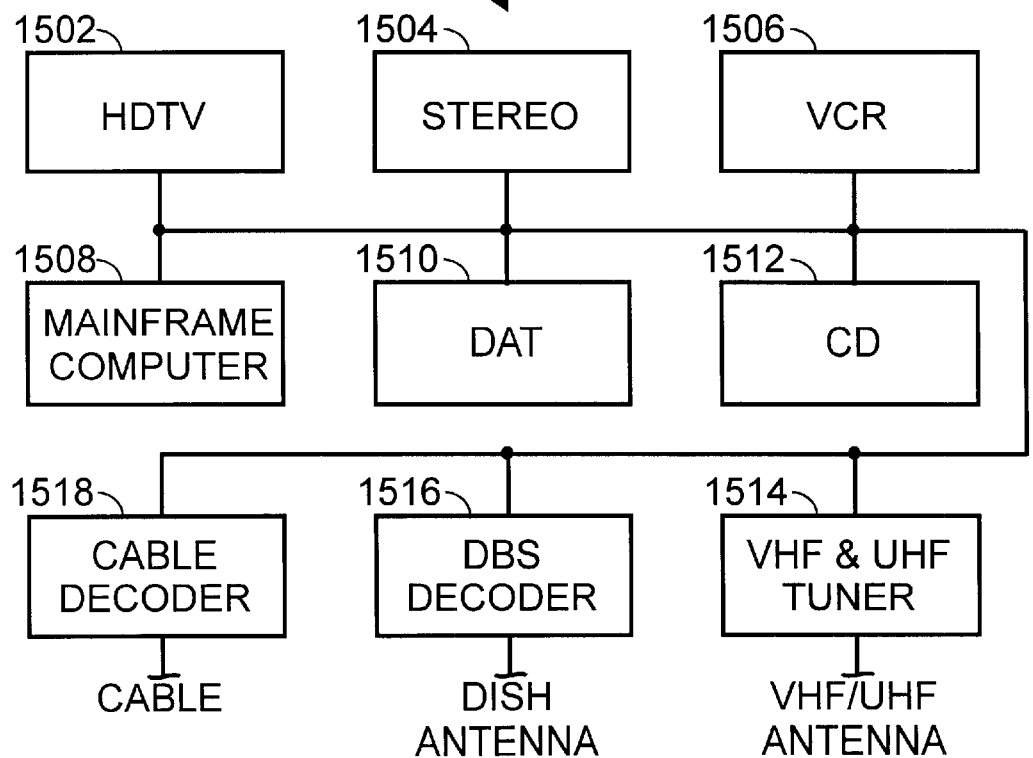
Figure 16:
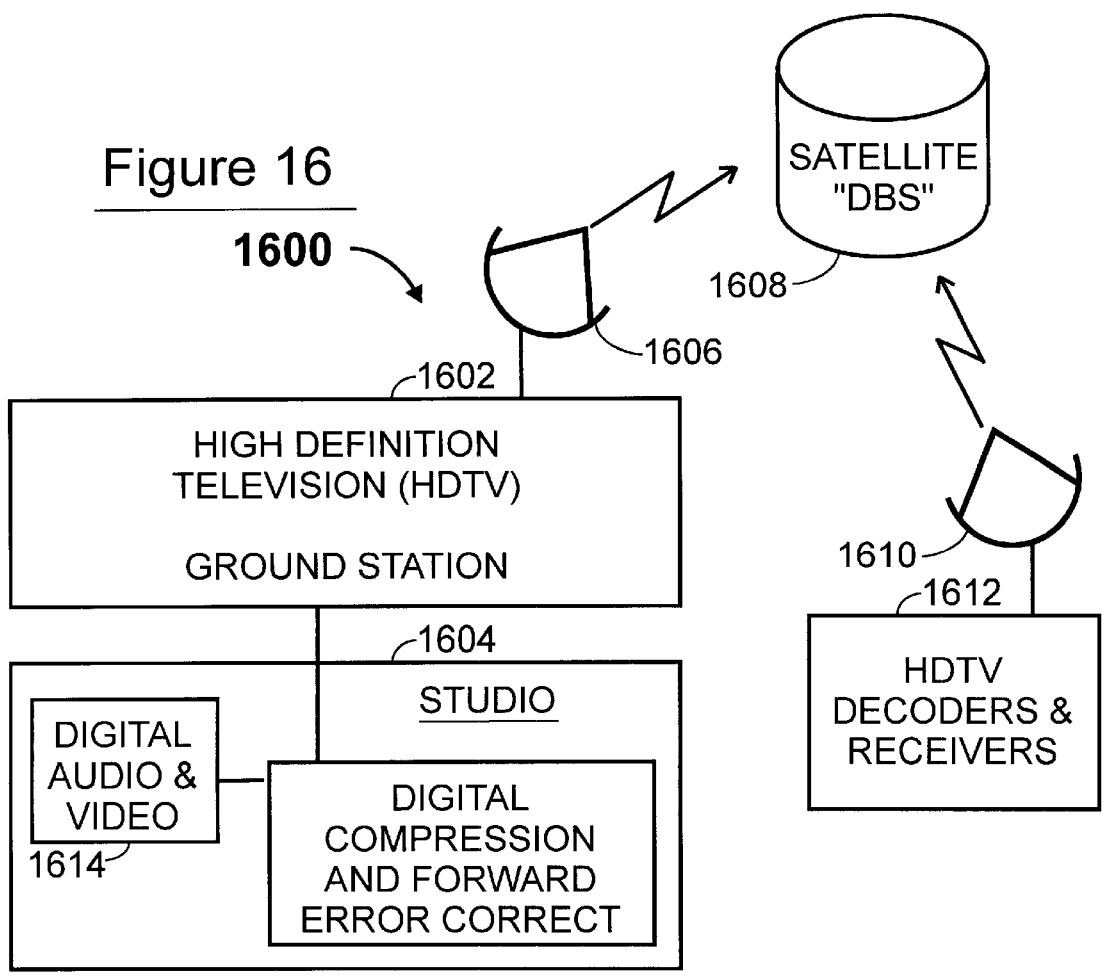
Figure 17:
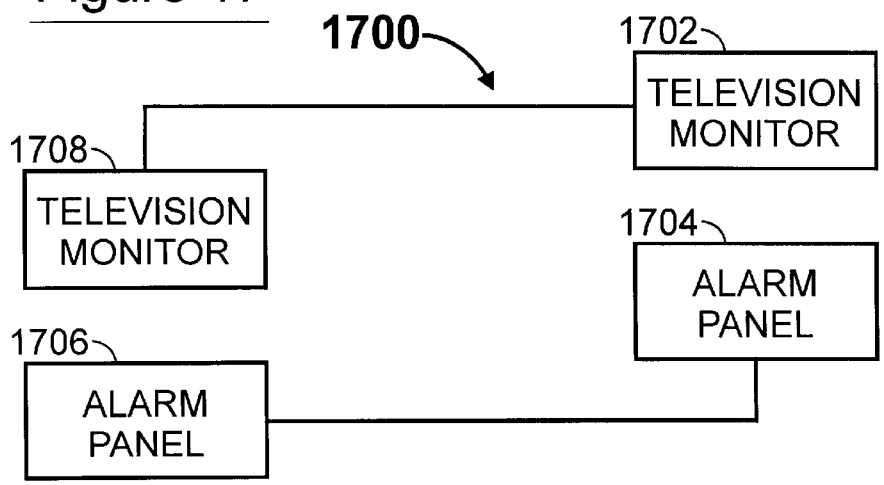
Figure 18:
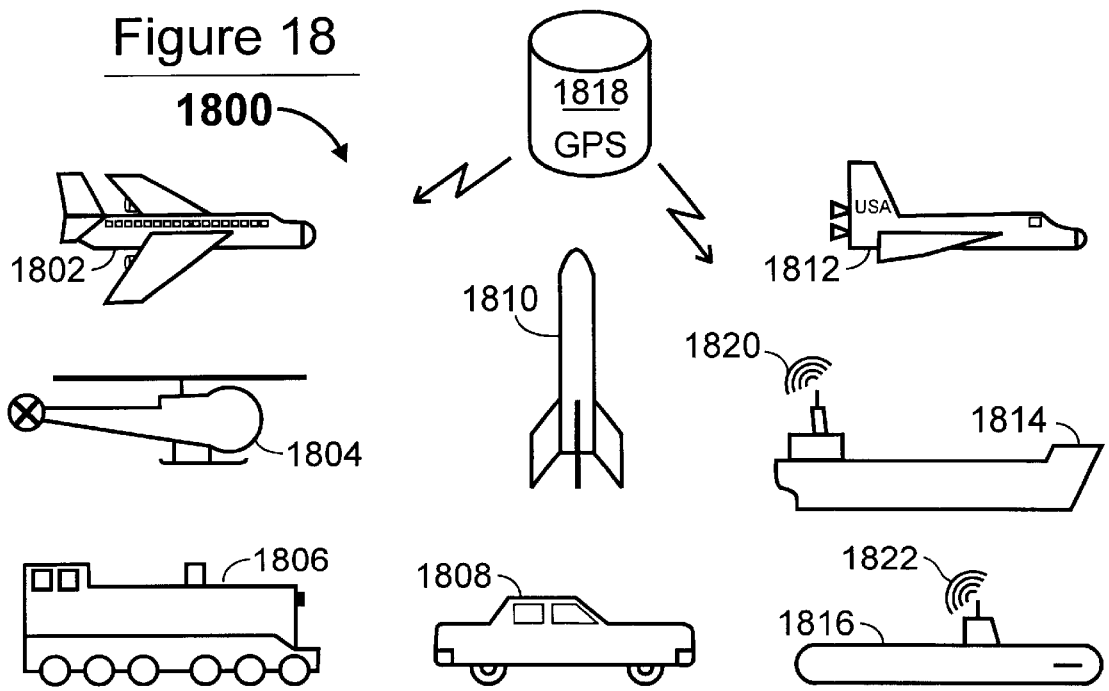
Figure 19:
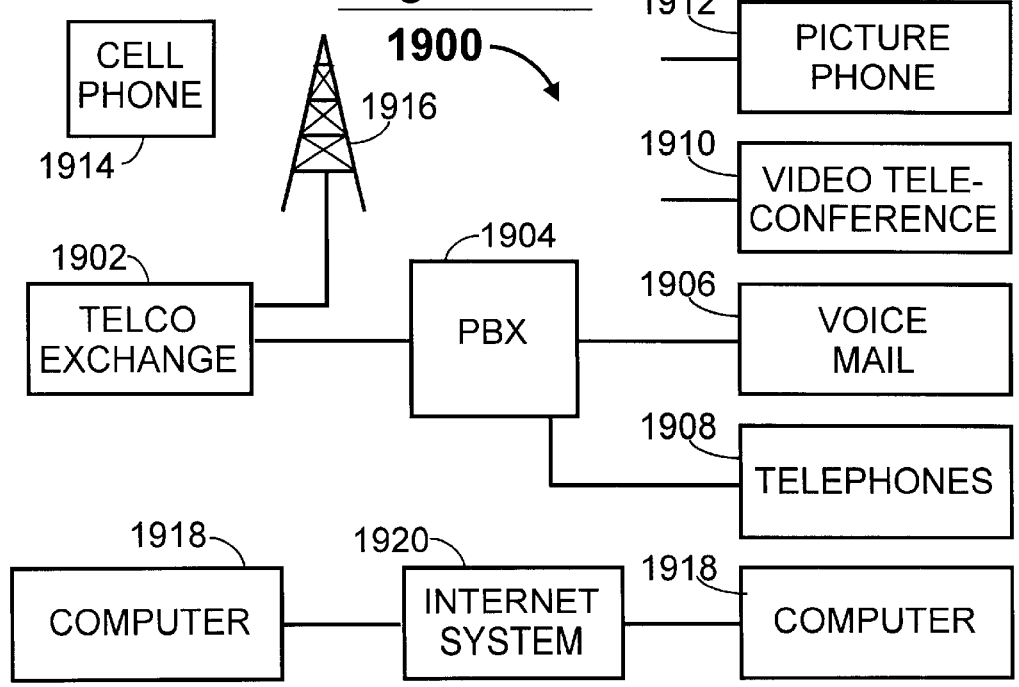

The structure, operation, and advantages of the present preferred embodiment of the invention will become further apparent upon consideration of the following description taken in conjunction with the accompanying drawings, wherein:

FIG. 1 is a top plan view of an integrated circuit (IC) chip showing a generalized topographical layout of an antenna and various circuits on the chip, according to the prior art;

FIG. 2 is a top plan view of an exemplary embodiment of an IC chip having an antenna formed thereon, according to the invention;

FIG. 3 is a top plan view of an alternate exemplary embodiment of an IC chip having an antenna formed thereon, according to the invention;

FIG. 3A is a top plan view of an alternate exemplary embodiment of an IC chip having an antenna formed thereon, according to the invention;

FIG. 4 is a top plan view of an alternate exemplary embodiment of an IC chip having an antenna formed thereon, according to the invention;

FIG. 5 is a top plan view of an alternate exemplary embodiment of an IC chip having an antenna formed thereon, according to the invention;

FIG. 6 is a top plan view of an exemplary embodiment of an IC chip having two antennas formed thereon, according to the invention;

FIG. 7A is a top plan view of an alternate exemplary embodiment of an IC chip having two antennas formed thereon, according to the invention;

FIG. 7B is a partial (certain elements omitted, for illustrative clarity) cross-sectional view of the IC chip of FIG. 7A, taken on the line 7B—7B through the view of FIG. 7A, according to the invention;

FIG. 8 is a side view of an alternate exemplary embodiment of an IC chip connected to an antenna in a heatsink disposed on the IC chip, according to the invention;

FIG. 9 is a schematic block diagram of a system incorporating the technique(s) of the present invention;

FIG. 9A is an illustration of a general purpose computer incorporating the technique(s) of the present invention;

FIG. 9B is an illustration of a wireless telephone (cell phone) incorporating the technique(s) of the present invention;

FIG. 10 is a schematic elevational view of a single chip module illustrated in cross section;

FIG. 11 is a schematic perspective view of a multi-chip module;

FIG. 12 is a schematic top view of a board level product;

FIG. 13 is a schematic top view of a box level product;

FIG. 14 a schematic block diagram of a computer system;

FIG. 15 a schematic block diagram of an entertainment system;

FIG. 16 is a schematic block diagram of an information and entertainment transmission system;

FIG. 17 is a schematic block diagram of a security and surveillance system;

FIG. 18 is a schematic block diagram of a plurality of transportation systems; and FIG. 19 is a schematic block diagram of a plurality of communications and information transmission systems.

DETAILED DESCRIPTION OF THE INVENTION

FIG. 1 is a top plan view of an antenna structure of the prior art, and has been described hereinabove. The antenna 104 illustrated therein is a multi-turn loop antenna in the form of a square spiral.

By way of background, a single-turn loop antenna is a metallic conductor bent into the shape of circle or square, with a gap in the conductor to form the terminals. A multi-turn loop is a series connection of overlaying turns.

For a transmitting loop, the driving point voltage and current is proportional to radiation resistance (Rr) of the loop and is given by the following equation (eqn 1):

$$Rr = ((Mo/Eo)/6\pi)^{-2} * (2\pi/L)^4 (NA)^2$$

where:

$(Mo/Eo)^{-2}$ is the wave impedance of the space $2\pi/L$ is the propagation constant in the space N is the number of turns in the loop A is the area of the loop For a receiving loop, the voltage (Vr) developed at its open-circuited terminals is given by the following equation (eqn 2):

$$Vr = jwNAB_z$$

where:

j is the square root of minus 1;

w is angular frequency ($2\pi f$);

N is the number of turns in the loop;

A is the area of the loop; and $B_z$ is the component of incident magnetic density normal to the plane of the loop.

The open-circuited voltage at the terminals of the receiving loop can be increased by filling the loop with a core of permeable material like ferrite, which increases the magnetic flux through the area.

As can be seen by the expressions above, the transmitting and receiving strength is proportional to the number of turns and area of the loop.

Non-Peripheral Antennas

As mentioned hereinabove, and as discussed with respect to FIG. 1, forming an antenna (e.g., a loop, multi-turn loop or square spiral antenna in a peripheral area of an integrated circuit (IC) chip can interfere with conventional peripheral bond pad layout, and also may have adverse effects upon circuitry located within the antenna.

According to an embodiment of the invention, an antenna is formed on other than a peripheral area of an integrated circuit (IC) chip.

FIG. 2 illustrates an exemplary embodiment 200 of the invention wherein an antenna 204 is disposed on an integrated circuit (IC) chip 202. In this and subsequently-described embodiments of the invention, it is presumed that an IC chip is a substrate having a front surface and a back surface, and the antenna (204 of this embodiment) is one or more conductive traces formed in a conventional manner on the front surface of the IC chip using either metallization, polysilicon, or comparable electrically-conductive material.

In this example, the chip 202 has a plurality of bond pads 206 disposed in a peripheral area on the surface of the chip 202. An entire central area of the chip 202, indicated by the dashed line 208, is bounded by the bond pads 206. A first portion of the central area 208 of the chip 202 is indicated by the dashed line 210. A second portion of the central area 208 of the chip 202 is indicated by the dashed line 212.

According to this embodiment of the invention, the antenna 204 is disposed within the second portion 212 of the central area 208 of the chip 202, and related circuitry (not shown) is disposed within the first portion 210 of the central area 208 of the chip 202.

As will become evident, from the descriptions of alternate antenna embodiments that follow, the antenna 204 may be other than a loop, multi-turn loop or square spiral antenna.

However, in this embodiment 200, the antenna 204 is illustrated as a multi-turn loop antenna having two ends 204*a* and 204*b* that extend from the antenna 204, which is in the second portion 212 of the central area 208 of the chip 202 into the first portion 210 of the central area 208 of the chip 202 so as to be connected to circuitry (not shown) disposed within the first portion 210 of the central area 208 of the chip 202.

It should be understood that the area 212 occupied by the antenna 204 could extend to one or two or three (but not all four) edges of the chip 202, so long as there are no bond pads (206) in that area.

Long-Wire Antennas

As mentioned above, the antenna of the present invention may be other than in the form of a loop, multi-turn loop or square spiral.

According to an embodiment of the invention, an antenna is formed as other than a loop, multi-turn loop, or square spiral.

FIG. 3 illustrates an embodiment 300 of the invention wherein an antenna 304 (compare 204) is formed as a long "wire". In practice, the "wire" 304 is a conductive trace on the surface of the IC chip 302 (compare 202) formed in one of the metallization layers (not shown, well known) and has two ends 304*a* and 304*b*. A one end 304*a* of the long wire antenna 304 is connected (as indicated by the dot) to other circuitry (not shown, well known) on the IC chip 302. As is known, a long wire antenna only requires connection to one end thereof. Typically, a ground plane would be present on the IC chip 302 to cooperate with the long wire antenna 304.

The long wire antenna 304 is shown as being disposed in a central area of the IC chip 302 which is within a peripheral area occupied by the bond pads 306 (compare 206) of the IC chip 302. However, it should be understood that the long wire antenna 304 can be disposed across the entire surface of the IC chip 302, including extending to within the peripheral area.

FIG. 3A illustrates an alternate embodiment 350 of a long wire antenna, wherein the antenna 354 (compare 304) is illustrated as taking a serpentine (rather than straight line) path along the surface of the IC chip 352 (compare 302). The antenna 354 is shown as having two ends 354*a* (compare 304*a*) and 354*b* (compare 304*b*), and as being disposed in a central area on the surface of the IC chip 356 although, as in the previously-described embodiment, the antenna may extend across the entire surface of the IC chip 352, including extending to within the peripheral area where bond pads 356 (compare 306) are shown. The antenna 354 is exemplary of a long wire antenna formed with one or more s-curves or z-curves in it.

Dipole Antennas

As mentioned above, the antenna of the present invention may be other than in the form of a loop, multi-turn loop or square spiral.

According to an embodiment of the invention, an antenna is formed as other than a loop, multi-turn loop, square spiral or long wire.

FIG. 4 illustrates an embodiment 400 of the invention wherein an antenna 404 (compare 304) is formed as a dipole. In practice, the dipole 404 is two conductive traces 410 and 412 on the surface of the IC chip 402 (compare 302) formed in one of the metallization layers (not shown, well known).

The two traces 410 and 412 are preferably collinear. The trace 410 has two ends 410*a* and 410*b*. The trace 412 has two ends 412*a* and 412*b*. The one end 410*a* of the trace 410 is connected (as indicated by the dot) to other circuitry (not shown, well known) on the IC chip 402. The one end 412*a* of the trace 412 is connected (as indicated by the dot) to other circuitry (not shown, well known) on the IC chip 402, and is preferably closely adjacent to the one end 410*a* of the other trace 410, as illustrated.

The dipole antenna 404 is shown as being disposed in a central area of the IC chip 402 which is within a peripheral area occupied by the bond pads 406 (compare 306) of the IC chip 402. However, it should be understood that the dipole antenna 404 can be disposed across the entire surface of the IC chip 402, including extending to within the peripheral area.

Programmable Length Antennas

As a general proposition, the resonant frequency of an antenna is inversely proportional to its overall length. And, as is known, wavelength is inversely proportional to frequency.

FIG. 5 illustrates an embodiment 500 of the invention wherein a long wire type antenna 504 (compare 304) is formed to have two or more (three shown) segments 510, 512 and 514. In a manner similar to the dipole 404 antenna, the segments are preferably collinear conductive traces formed in one of the metallization layers (not shown, well known) of the IC chip 502.

The trace 510 has two ends 510*a* and 510*b*. The trace 512 has two ends 512*a* and 512*b*. The trace 514 has two ends 514*a* and 514*b*. The one end 510*a* of the trace 410 is connected (as indicated by the dot) to other circuitry (not shown, well known) on the IC chip 402. The other end 510*b* of the trace 510 is closely adjacent (as shown) the one end 512*a* of the trace 512, and the other end 512*b* of the trace 512 is closely adjacent (as shown) the one end 514*a* of the trace 514.

The trace 510 functions as a long wire antenna having an effective length. By selectively connecting the trace 512 to the trace 510—in other words, by connecting the end 512*a* of the trace 512 to the end 510*b* of the trace 510, the effective length of the long wire antenna can be increased. Similarly, by selectively connecting the trace 514 to the trace 512—in other words, by connecting the end 514*a* of the trace 514 to the end 512*b* of the trace 512, the effective length of the long wire antenna can further be increased. Such connections of the traces 510, 512 and 514 are readily accomplished in a final metallization step (not shown, well known), or with fusible links, or the like. In this manner, a long wire antenna of "programmable" length can be implemented on an integrated circuit (IC) chip.

The programmable-length long wire antenna 510/512/514 is shown as being disposed in a central area of the IC chip 502 which is within a peripheral area occupied by the bond pads 506 (compare 406) of the IC chip 502. However, it should be understood that the programmable-length long wire antenna 510/512/514 can be disposed across the entire surface of the IC chip 502, including extending to within the peripheral area.

Multiple Antennas

As mentioned above, as a general proposition, the transmitting and receiving strength of a loop-type antenna is proportional to the number of turns and area of the loop.

According to an embodiment of the invention, two or more antennas are formed on an integrated circuit (IC) chip.

FIG. 6 illustrates an embodiment 600 of the invention wherein two antennas 604 (compare 204) and 624 are disposed on a single integrated circuit (IC) chip 602 (compare 202).

In this example, the IC chip 602 has a plurality of bond pads 606 (compare 202) disposed in a peripheral area on the surface of the chip 602. An entire central area of the chip 602, indicated by the dashed line 608 (compare 208), is bounded by the bond pads 606. A first portion of the central area 608 of the chip 602 is indicated by the dashed line 610 (compare 210). A second portion of the central area 608 of the chip 602 is indicated by the dashed line 612. A third portion of the central area 608 of the chip 602 is indicated by the dashed line 614.

According to this embodiment of the invention, the antenna 604 is disposed within the second portion 612 of the central area 608 of the chip 602, the antenna 624 is disposed within the third portion 614 of the central area 608 of the chip 602, and related circuitry (not shown) is disposed within the first portion 610 of the central area 608 of the chip 602.

Although shown as multi-turn loops, it should be understood that the antennas 604 and 624 may be other than a loop, multi-turn loop or square spiral antenna. However, in this embodiment 600, the antenna 604 is illustrated as a multi-turn loop antenna having two ends 604a and 604b that extend from the antenna 604, which is in the second portion 612 of the central area 608 of the chip 602 into the first portion 610 of the central area 608 of the chip 602 so as to be connected to circuitry (not shown) disposed within the first portion 610 of the central area 608 of the chip 602. Similarly, the antenna 624 is illustrated as a multi-turn loop antenna having two ends 624a and 624b that extend from the antenna 624, which is in the third portion 614 of the central area 608 of the chip 602 into the first portion 610 of the central area 608 of the chip 602 so as to be connected to circuitry (not shown) disposed within the first portion 610 of the central area 608 of the chip 602.

It should be understood that the area 612 occupied by the antenna 604 could extend to one or two or three (but not all four) edges of the chip 602, so long as there are no bond pads (606) in that area. Similarly, it should be understood that the area 614 occupied by the antenna 624 could extend to one or two or three (but not all four) edges of the chip 602, so long as there are no bond pads (606) in that area.

Suitably, the antenna 604 can function as a transmitting antenna, and the antenna 624 can function as a receiving antenna (or vice-versa). However, the antennas 604 and 624 can otherwise be connected to function as a "two-part" antenna.

The antennas 604 and 624 are shown as being disposed entirely in a central area 608 of the IC chip 602. However, it should be understood that one or both of the antennas 604 and 624 can be disposed so as to also be in the peripheral area. This should be understood to include a one of the antennas disposed entirely within the peripheral area (as illustrated in FIG. 1), the other of the antennas being disposed within a central area of the IC chip.

In the figures, the antennas 604 and 624 are shown as not being connected to one another. In such a case, the two antennas 604 and 624 can function independently, such as one antenna being a receiving antenna and the other antenna being a transmitting antenna. However, it should clearly be understood that the two antennas 604 and 624 can, in fact, be connected with one another, such as in series with one another. For example, the end 604a of the antenna 604 can be connected to circuitry (not shown) on the chip 602, the end 604b of the antenna 604 can be connected to the end 624a of the antenna 624, and the end 624b of the antenna 624 can be connected to the other circuitry on the chip 602.

Stacked Loops

As mentioned above, as a general proposition, the transmitting and receiving strength of a loop-type antenna is proportional to the number of turns and area of the loop.

According to an embodiment of the invention, a loop antenna formed on an IC chip can be implemented by stacking loops formed in polysilicon layer and all metal layers and connecting them through vias.

FIGS. 7A and 7B illustrate an embodiment 700 of the invention wherein two antennas 704 and 724 are disposed in two different vertical planes on a single integrated circuit (IC) chip 702 (compare 202). The IC chip 702 is shown as having bond pads 706 (compare 206) in a peripheral area thereof, although this does not form part of the present invention.

It is well known in integrated circuit manufacturing processes to have two or more metallization layers, separated from one another by an insulating layer, and to pattern the metallization layers to have lines, and to interconnect one metallization layer to another by metal-filled "vias" which are openings though an insulating layer. Each metallization layer represents a different "wiring plane".

A first antenna 704 is illustrated as a simple single loop antenna having two ends 704a and 704b which is formed in a first metallization layer. A second antenna 724 is illustrated as a simple single loop antenna having two ends 724a and 724b which is formed in a second metallization layer. An insulating layer 710 is disposed between the first and second metallization layers.

As best viewed in FIG. 7B, vias are formed and filled (with metal, shown cross-hatched) in the insulating layer 710 underneath the ends 724a and 724b of the antenna 724 to electrically connect the ends 724a and 724b of the antenna 724 to corresponding terminals 734a and 734b formed in the first metallization layer.

In the figures, the antenna 704 is shown as being smaller than and concentric with the antenna 724, for illustrative clarity. However, it should clearly be understood that the antenna 724 can be directly over the antenna 704, and that both antennas can be disposed anywhere on the IC chip 702—in other words, not necessarily in a central area, including extending to within the peripheral area which is shown as being occupied by bond pads 706. For example, the antenna 704 could be directly under peripheral bond pads, and the antenna 724 could be formed within a central area of the IC chip 702.

In the figures, the antennas 704 and 724 are shown as not being connected to one another. In such a case, the two antennas 704 and 724 can function independently, such as one antenna being a receiving antenna and the other antenna being a transmitting antenna. However, it should clearly be understood that the two antennas 704 and 724 can, in fact, be connected with one another, such as in series with one another. For example, the end 704a of the antenna 704 can be connected to circuitry (not shown) on the chip 702, the end 704b of the antenna 704 can be connected to the end 724a (by means of terminal 734a) of the antenna 724, and the end 724b (by means of terminal 734b) of the antenna 724 can be connected to the other circuitry on the chip 702.

It should clearly be understood that although the two antennas 704 and 724 are shown as single loop antennas, they can be formed as any of the types of antennas described herein.

Add-On Antennas

As mentioned above, as a general proposition, the transmitting and receiving strength of a loop-type antenna is proportional to the number of turns and area of the loop.

In the embodiments described hereinabove, one or more antennas are integrally formed on the IC chip.

According to an embodiment of the invention, an external antenna can intimately be formed with an IC chip as part of a "semiconductor assembly".

FIG. 8 illustrates an embodiment of the invention which is a semiconductor assembly 800. An antenna 840 is disposed external to an integrated circuit (IC) die 802 which may have another antenna integrated thereon as described with respect to the previous embodiments. The antenna 840 is disposed in a heat sink structure 830, such as in a fin 832 of the heat sink. The base (bottom portion, as illustrated) of the heat sink 830 is intimately joined (i.e., is in intimate contact with) a surface of the IC chip 802. The IC chip 802 (compare 202) is shown having a plurality of bond pads 806 (compare 206) on its surface.

Selected ones of the bond pads 806 are connected by bond wires to corresponding bond pads 826 on an upper (as viewed) surface of a package substrate 820, such as a ball grid array (BGA) substrate. The substrate 820 is shown having ball bumps 822 disposed on its lower (as viewed) surface.

Selected ones of the bond pads 806 are connected by bond wires to corresponding bond pads 836 on the heat sink structure 830. The antenna 840 is connected by conductive lines 842 and 844 to the bond pads 836.

In this manner, an external antenna 840 is provided as part of a structure 830 which is in intimate contact with the IC chip 802. As mentioned, the IC chip 802 may (or may not) also have one or more antenna structures integrally formed therewith in the manner of the previously-described embodiments. The heat sink structure serves both as antenna and heat dissipating unit.

Permeable-Core Antennas

The antennas described hereinabove have generally been air-core antennas. As is known, permeable material like ferrite can be disposed within an antenna to increase the receiving strength of the antenna. This may reduce the radiation efficiency (τ) of the antenna, given by the following equation [eqn 3]:

$$\tau = Pr/Po$$

where:

Pr is the power radiated by the antenna; and

Po is the power accepted by the antenna.

It is within the scope of the invention that a separate receiving antenna may be designed on the same chip with permeable material deposited, to act a core.

Normally transmission line structures perform poorly on the semi-conducting substrates used to manufacture silicon ICs. An efficient and scalable model can be used to optimize the electrical performance and can be used to evaluate for variations in metallization thickness, layout geometry and substrate parameters.

Although the foregoing detailed description has primarily been directed to exemplary preferred embodiments of the present invention, it should be understood that this has been done by way of example only and not by way of limitation System Integration It is clearly contemplated that the technique(s) of the present invention, as disclosed hereinabove, can be integrated with other electronic components and subsystems to realize a subsystem or a system having electrical functionality such as, but not limited to: general-purpose computers; telecommunication devices (e.g., phones, faxes, etc); networks; consumer devices; audio and visual (video) receiving, recording and display devices and systems; and vehicles such as planes, trains and automobiles.

FIG. 9 illustrates an example of such an overall system 900. As shown therein, an electronic component 902 incorporating the technique(s) of the present invention can be connected, along with at least one other electronic component 904, on an interconnection substrate (e.g., motherboard) 906, thereby forming a subsystem 908, to which a number of peripheral (e.g., external) devices may be connected. Exemplary peripheral devices may include:

one or more devices 910 for providing inputs to the subsystem 908, such as keyboards, pointing devices, digitizing tablets, and the like;

one or more devices 912 for receiving outputs from the subsystem 908, such as video monitors, and the like; and one or more devices 914 for engaging in two-way communications with the subsystem 908, such as modems, printers, and the like.

It is clearly within the purview of a person having ordinary skill in the art to which the present invention most nearly pertains to effect such system integration, based on the descriptions set forth hereinabove.

FIG. 9A illustrates, for example, a general purpose computer 920 (compare 900) incorporating the present invention.

FIG. 9B illustrates, for example, a wireless telephone 940 (compare 900) incorporating the present invention. Many other combinations of features, some of which have been expressly set forth hereinabove, are within the spirit and scope of this invention and may be advantageously utilized in SCM, MCM, and BLP systems as contemplated herein.

System level products may be designed and fabricated in various forms. A system level product may, for example, include a single chip modules ("SCM") having a single semiconductor die in a single package body, with or without other electrical components, such as capacitors. System level products may also include multi-chip modules ("MCM") having two or more semiconductor dies in the same or separate package bodies, with or without other electrical components. System level products may also include board level products ("BLP"), such as those having one or more semiconductor devices on one or more printed wiring boards. Box level products ("Boxes") are also system level products which may include a combination of SCMs, MCMs, BLPs, and/or other devices. One or more of such SCMs, MCMs, BLPs or Boxes may act as, or be integrated into, a functional system or subsystem or the like.

System level products can be employed to carry out numerous applications and in various environments. For example, system level products may include:

(a) computer systems comprising personal computers, work stations, servers, embedded logic controllers, digital data storage, minicomputers, mainframe computers and super computers;

(b) information and entertainment transmission systems comprising telecommunications, satellite, cable, cellular telephones, private branch exchange, telephone switching, and video picture telephones wherein the information may be digitally compressed and forward error corrected;

(c) entertainment systems comprising digital video and audio systems, such as digital analog tape and high definition television, playback devices, display and reproduction means, for example, televisions, cameras, recorders, compact disc players/recorders, digital tape players/recorders and the like;

(d) security and surveillance systems comprising home and business security intrusion, flood and fire systems; vehicle alarms;

(e) information, data acquisition and control systems comprising industrial plant sensors and control means, and control systems utilizing information from the sensors to actuate the control means; and (f) transportation systems comprising airplanes, trains, automobiles, helicopters, rockets, missiles, boats and submarines, and the like, as well as subsystems utilized in the transportation systems, which include positioning systems (for example, global positioning systems), navigational displays and controllers, hazard avoidance systems (such as radar and sonar), fly by wire control systems and engine controlling and monitoring systems.

The above mentioned systems may also be combined to comprise larger and more complex systems that can be utilized to facilitate the infrastructure of a home, business, municipality, government entity, city wide community, state governance, world wide communications, information distribution and security.

In an SCM, a single semiconductor die is packaged and x-adapted for connection to external systems. This usually involves mounting the die to some sort of substrate, lead frame or carrier, connecting the bond pads on the die to some sort of conductive leads or traces and forming a package body around the die. The conductive leads or traces exit the package body, and usually terminate in external leads, pins or solder balls.

Referring to FIG. 10, a schematic elevational view of a SCM is illustrated in cross section. The SCM 1000, as illustrated, is a ball bump grid array semiconductor package. A semiconductor die 1002 is mounted to the top surface of a central area 1003 of a substrate 1004. The semiconductor die has conductive lines 1012 formed thereon (not illustrated). The top surface 1006 of the substrate 1004 is provided with a number of conductive traces 1008 that extend from near the periphery of the substrate 1004 to the central area 1003. The die 1002 has bond pads 1010 thereon. Bond wires 1014 extend from the bond pads 1010 to inner ends of the traces 1008. Near the periphery of the substrate 1004, there are plated (conductive) through-holes (vias) 1016 extending from the bottom surface 1018 of the substrate 1004, through the substrate to a respective trace 1008. The bottom surface 1018 of the substrate is provided with a number of conductive traces 1020, each having an end connected with a respective via 1016. In this manner, signals (and power) to and from the die are connected through the bond wires 1014, through the top side traces 1008, through the vias 1016, to the bottom side traces 1020. Solder balls 1024 are attached to the traces 1020. A package body 1026 is formed over the die 1002, and partially covers the top surface of the substrate 1004.

Pin grid array semiconductor packages, chip carriers (leaded or leadless), flat packs (such as plastic quad gullwing flat packs), ceramic packages and small outline integrated circuits are also examples of SCMs. Numerous other examples, designs and types of SCMs are known to those of ordinary skill in the art of semiconductor integrated circuit packages.

When two or more semiconductor dies are mounted in the same or separate package body, with or without other electrical components, the resulting assembly is typically referred to as a multi-chip module (MCM).

In order to connect to one of the two or more semiconductor dies of a MCM, a substrate having conductive traces (like substrate 1004 of FIG. 10) is often used. Additional components such as capacitors, resistors and inductors may be mounted to the substrate. Often, the interconnections between the various components mounted to the substrate necessitate a large number of conductive traces which need to cross one another. In such cases, it is known to provide a substrate, having alternating layers of insulating material (such as fiberglass, teflon, FR4, ET resin, and the like) and conductive trace patterns (typically formed of metal foils, such as copper). The conductive traces from one layer are typically connected to the conductive traces of another layer by plated through-holes or vias.

FIG. 11 illustrates a schematic perspective view of a MCM. MCM 1100 comprises a substrate 1106 having conductive lines formed thereon (not illustrated), at least two semiconductor dies 1102 and 1104 disposed on the substrate 1106 and electrically connected to conductive lines (not illustrated) of the substrate 1106 by the outer tips of lead frame leads 1108. The dies 1102 and 1104 may be physically mounted to the substrate 1106. The two semiconductor dies 1102 and 1104 are illustrated encapsulated, however, non-encapsulated flip-chip ball bump dies are also contemplated. One or more layers of conductive traces and plated through-holes (not illustrated) may be disposed within substrate 1106 and are used to connect the semiconductor dies 1102 and 1104 to one another and to external connections 1110, such as the solder ball bump structures as described above. Additional electrical components, such as capacitors, resistors and inductors (not illustrated) may also be disposed on and connected to the substrate 1106. Numerous other examples, designs and types of MCMs are known to those of skill in the art of semiconductor packages.

A BLP typically includes one or more semiconductor devices (such as a single chip module and/or a multi-chip module), in addition to other components, on one or more printed wiring boards.

FIG. 12 illustrates a schematic top view of a board level product (BLP). The BLP 1200 comprises an array of SCMs 1000, a MCM 1100, and a memory component 1104. The SCMs 1000, the MCM 1100, and memory 1204 are each disposed on and connected to a printed wiring board 1202. The printed wiring board 1202 provides for all connections between those components. Examples of BLPs include central processing unit boards, memory boards, and interface boards (as are routinely utilized in computer systems).

Boxes are also system level products which may include a combination of SCMs, MCMs, BLPs, and/or other devices. For example, multiple board level products may be connected in parallel with one another by a bus (such as a back plane bus, which is also referred to as a mother board), which communicates signals therebetween. Numerous other examples, designs and types of Boxes are readily apparent to one of ordinary skill in the art. The conductive leads wires exit the boxes, and are usually terminated at external leads or pins.

FIG. 13 illustrates a schematic top view of a box level product. The box level product 1300 comprises at least one printed wiring board 1202 as described above, a power supply 1302 and an enclosure or box 1304 containing the at least one board 1202 and the power supply 1302. One or more box level products may be used to create more complex systems according to the present invention.

FIG. 14 illustrates a schematic block diagram 1400 of various computer systems interconnected together via various digital data transmission systems. A file server 1402 is connected to a digital data storage device 1404 such as, for example, magnetic hard disk, tape, optical disk, flash memory, core memory, semiconductor memory and the like. The server 1402 may be connected to at least one personal computer 1406, a work station 1408, a minicomputer 1410, a mainframe computer 1412, and a super computer 1414 through a number of digital data transmission system networks such as token ring, star, coaxial, fiber-optic and the like. These networks may utilize data protocols such as Scaleable Coherent Interface ("SCI"), ANSI/IEEE Std 1596-1992 SCI, Asynchronous Transfer Mode ("ATM"), FiberChannel, SerialBus, SCSI, SSA, QuickRing, HIPPI, FDDI, Ethernet and the like.

FIG. 15 is a schematic block diagram of an entertainment system according to the present invention. The entertainment system 1500 may be comprised of the following component subsystems: a high definition television (HDTV) 1502, a stereo 1504, a video cassette recorder (VCR) 1506, a television camera/recorder (Camcorder) 1508, a digital audio tape unit (DAT) 1510, a compact disk player (CD) 1512, a VHF/UHF tuner 1514, a direct broadcast satellite (DBS) decoder 1516, and a cable decoder 1518. These component subsystems are made up of SCM, MCM, BLP and boxes as disclosed above.

The DBS decoder 1516 receives a digitally encoded and forward error corrected signal from a dish antenna (not illustrated) which receives a DBS entertainment signal from a geosynchronous satellite (see FIG. 16). Hardwired cable is connected to the cable decoder 1518 which decodes and converts the cable entertainment channels to signals for viewing on the HDTV 1502 or a standard television (not illustrated). Standard broadcast television and stereo signals may be received by the VHF/UHF tuner 1514 and the base band signals made available to the HDTV 1502, stereo 1504 and the other recording devices (VCR 1506, DAT 1510). Similarly, recorded entertainment information may be played on the HDTV 1502 and stereo 1504 from the playback devices OAT 1510, Camcorder 1508, CD 1512, VCR 1506) for viewing and listening enjoyment by the user.

FIG. 16 is a schematic block diagram of an information and entertainment communications system according to the present invention. The information and entertainment communications system 1600 is comprised of the following systems: A HDTV ground station 1602 which transmits a digitally encoded and forward error corrected signal from the HDTV studio 1604 by microwave dish 1606 to a DBS satellite 1608. The satellite 1608 rebroadcasts the signal from the studio 1604 to a plurality of ground station dish antennas 1610 which are connected to corresponding HDTV receivers/decoders 1612 where the DBS satellite signal is processed and made available, for example, to the entertainment system 1500. The system 1600 is comprised of many SCM, MCM, BLP and box level subsystems which greatly benefit from the features, aspects and advantages of the present invention. Some of these subsystems are a digital audio and video formatting subsystem 1614 which convert the analog entertainment information into a digital format, and a digital compression and forward error connection subsystem 1616 which prepares the digitally encoded entertainment information for transmission by the ground station 1602 to the satellite 1608.

FIG. 17 is a schematic block diagram of a security and surveillance system according to the present invention. The security and surveillance system 1700 is comprised of the following subsystems: A television camera 1702, intrusion detection sensors 1704, a sensor alarm panel 1706, and a television monitor 1708. The television monitor 1708 displays what the television camera(s) 1702 observe. The alarm panel 1706 displays the status of the sensors 1704 and will annunciate an alert upon a sensed alarm condition. The system 1700 may be utilized in homes, businesses, government building, military bases, prisons and any area requiring security and surveillance. In addition, another embodiment of the security and surveillance system 1700 may be utilized to monitor operating conditions of transportation systems such as engine status, hull integrity, operating temperatures, maintenance evaluation and other parameters deemed necessary for the safe and efficient operation of the transportation systems (see FIG. 19). In a further embodiment of subsystems for the transportation systems, positioning and navigational (GPS) systems may be utilized for hazard avoidance, as well as radar and sonar (see FIG. 19). Further, operation of the transportation systems may be implemented by digital control, such as "fly-by-wire", along with the monitoring thereof. The system 1700 and its subsystems may be utilized with the other system embodiments disclosed herein and will greatly benefit from the features, aspects and advantages of invention as disclosed hereinabove.

FIG. 18 is a schematic block diagram of a plurality of transportation systems according to the present invention. The transportation systems, generally referenced to by the numeral 1800, may utilize, individually or in combination, the aforementioned systems to great advantage. Embodiments of the transportation system 1800 is as follows: An airplane 1802, a helicopter 1804, a train 1806, a vehicle 1808 such as an automobile or truck, a rocket 1810, a space shuttle 1812, a ship 1814, a submarine 1816, and the like. Each of the embodiments of the transportation systems 1800 contemplated herein may greatly benefit from the communications, navigation and control systems disclosed herein along with he features, aspects and advantages of the present invention.

Each of the embodiments of the transportation systems 1800 may utilize a positioning and navigation system which derives its position information from a global positioning satellite system (GPS) 1818. The positioning and navigation system is comprised of SCM, MCM, 1LP and box level systems as discussed hereinabove. Radar 1820 and/or sonar 1822 systems may be utilized for collusion avoidance and location and may be incorporated with any of the transportation systems 1800.

FIG. 19 is a schematic block diagram of a plurality of communications and information transmission systems according to the present invention. The communications and information transmission systems 1900 may comprise, individually or in combination, a telephone exchange 1902, a PBX 1904, a voice mail system 1906, telephones 1908, a video teleconferencing system 1910, a video picture telephone 1912 and the like. The systems 1900 may also comprise a cellular telephone 1914, and a plurality of cell sites 1916 which may be connected with the telephone system 1902. Further, systems 1900 may be computers 1918 connected together through the internet system 1920. Both analog and digital communications are contemplated herein with the various features, advantages and aspects of the present invention.

Other MCM, SCM, mini-board, micro-board, board level and other system sub-assemblies are contemplated using the multi-layer substrate of the present invention. Additionally, such sub-assemblies or packages using such multi-layer substrate circuits may be used in traditional circuit boards or sub-assemblies for a system level product. Examples of electronic systems that may benefit from the system and method of the present invention have been mentioned above. The spirit and intent of the present invention is to utilize multi-layer conductive planes on a substrate for all electronic systems from a single semiconductor integrated circuit die to a complex multiple box electronic system.

The present invention, therefore, is well adapted to carry out the objects and attain the ends and advantages mentioned, as well as others inherent therein. While presently preferred embodiments of the invention and various aspects thereto have been given for purposes of disclosure, numerous changes in the details of construction, interconnection and arrangement of parts will readily suggest themselves to those skilled in the art and which are encompassed within the spirit of the invention and the scope of the appended claims.

While the present invention has been depicted, described, and is defined by reference to particularly preferred embodiments of the invention, such references do not imply a limitation on the invention, and no such limitation is to be inferred. The invention is capable of considerable modification, alternation, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

The present invention, therefore, is well adapted to carry out the objects and attain the ends and advantages mentioned, as well as others inherent therein.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein.

What is claimed is:

1. A device comprising:
an integrated circuit (IC) chip having a surface;
the surface having a peripheral area;
the surface having a central area within the peripheral area, the central area comprising a first portion and a second portion;
a circuitry of the IC chip disposed within the first portion of the central area; and
an antenna disposed within the second portion of the central area.

2. The device, according to claim 1, further comprising:
bond pads disposed within the peripheral area.

3. The device according to claim 2 wherein:
an entire of the central area is bounded by the bond pads.

4. The device, according to claim 1, wherein:
the antenna is selected from the group consisting of loop, multi-turn loop, square spiral, long wire, and dipole.

5. The A device, according to claim 1, wherein:
the antenna is formed of one or more conductive traces in a metallization layer on the IC chip.

6. The device, according to claim 1, wherein:
the antenna comprises a long wire following a serpentine path on the surface of the IC chip.

7. A device comprising:
an integrated circuit (IC) chip having a surface;
a circuitry disposed on the surface of the IC chip; and
an antenna disposed on the surface of the IC chip;
wherein:
the antenna comprises a long wire with only one of two ends thereof connected to the circuitry.

8. The device, according to claim 7, wherein:
the antenna is formed of one or more conductive traces in a metallization layer on the IC chip.

9. The device, according to claim 7, wherein:
the antenna extends to within a peripheral area of the IC chip.

10. A device comprising:
an integrated circuit (IC) chip having a surface;
a circuitry disposed on the surface of the IC chip; and
an antenna disposed on the surface of the IC chip;
wherein:
the antenna comprises a long wire with only one of two ends thereof connected to the circuitry and having two or more segments which can selectively be connected to one another to alter an effective length of the antenna.

11. The device, according to claim 10, wherein:
the antenna is formed of two or more collinear conductive traces in a metallization layer on the IC chip.

12. A device comprising:
an integrated circuit (IC) chip having a surface;
a circuitry disposed on the surface of the IC chip; and
two or more antennas disposed on the surface of the IC chip;
wherein:
the surface has a peripheral area;
the surface has a central area within the peripheral area;
one of the antennas is disposed within the peripheral area; and
another of the antennas is disposed within the central area.

13. The device, according to claim 12, wherein:
at least one of the antennas is selected from the group consisting of loop, multi-turn loop, square spiral, long wire, and dipole.

14. The device, according to claim 12, wherein:
the two antennas are formed in two different metallization layers separated by an insulating layer.

15. A device comprising:
an integrated circuit (IC) chip having a surface;
a circuitry disposed on the surface of the IC chip; and
two or more antennas disposed on the surface of the IC chip;
wherein:
the surface has a peripheral area;
the surface has a central area within the peripheral area;
the central area comprises a first portion, a second portion, and a third portion;
one of the antennas is disposed within the second portion of the central area; and
another of the antennas is disposed within the third portion of the central area.

16. The device, according to claim 15, wherein:
the antennas is formed of one or more conductive traces in a metallization layer on the IC chip.

17. The device, according to claim 15, wherein:

at least one of the antennas extends to within a peripheral area of the IC chip.

18. The device, according to claim 15, wherein:

a one of the two or more antennas functions as a transmitting antenna; and an other of the two or more antennas functions as a receiving antenna.

19. The device, according to claim 15, wherein:

two of the two or more antennas are connected to function as a two-part antenna.

20. The device, according to claim 15, further comprising:

bond pads disposed within the peripheral area.

21. The device, according to claim 20, wherein:

an entire of the central area is bounded by the bond pads.

22. An electronic system incorporating at least one device, said device comprising:

an integrated circuit (IC) chip having a surface;

the surface having a peripheral area;

the surface having a central area within the peripheral area, the central area comprising a first portion and a second portion;

a circuitry of the disposed within the first portion of the central area; and an antenna disposed within the second portion of the central area.

23. The electronic system, according to claim 22, wherein:

the electronic system is selected from the group consisting of general-purpose computer, telecommunication device, network device, consumer device, audio device, video device, receiver, recorder, display device, transportation system, electromechanical device, and smart card.

* * * * *